(12) United States Patent
Hwang et al.

(10) Patent No.: US 12,507,591 B2
(45) Date of Patent: Dec. 23, 2025

(54) DIODE ELEMENT AND SENSOR AND ELECTRONIC DEVICE

(71) Applicant: ADRC. CO. KR, Seoul (KR)

(72) Inventors: Chae Yeon Hwang, Seoul (KR); Donggyu Eo, Seoul (KR)

(73) Assignee: ADRC. CO. KR, Seoul (KR)

( * ) Notice: Subject to any disclaimer, the term of this patent is extended or adjusted under 35 U.S.C. 154(b) by 854 days.

(21) Appl. No.: 17/847,392

(22) Filed: Jun. 23, 2022

(65) Prior Publication Data

US 2023/0172063 A1    Jun. 1, 2023

(30) Foreign Application Priority Data

Nov. 29, 2021    (KR) .................. 10-2021-0167503

(51) Int. Cl.
*H01L 51/50* (2006.01)
*H10K 50/115* (2023.01)
*H10K 85/60* (2023.01)

(52) U.S. Cl.
CPC ....... *H10K 85/6572* (2023.02); *H10K 50/115* (2023.02)

(58) Field of Classification Search
None
See application file for complete search history.

(56) References Cited

U.S. PATENT DOCUMENTS

| | | | |
|---|---|---|---|
| 7,732,229 B2 | 6/2010 | Leidholm et al. |
| 8,198,117 B2 | 6/2012 | Leidholm et al. |
| 8,525,152 B2 | 9/2013 | Leidholm et al. |
| 9,190,458 B2 | 11/2015 | So et al. |
| 11,417,850 B2 | 8/2022 | Kim et al. |
| 11,744,094 B2 | 8/2023 | Kim et al. |
| 2007/0000537 A1 | 1/2007 | Leidholm et al. |
| 2008/0308148 A1 | 12/2008 | Leidholm et al. |
| 2010/0243049 A1 | 9/2010 | Leidholm et al. |
| 2014/0070191 A1 | 3/2014 | So et al. |

(Continued)

FOREIGN PATENT DOCUMENTS

| | | |
|---|---|---|
| JP | 2009-081296 | 4/2009 |
| KR | 10-2008-0052596 | 6/2008 |

(Continued)

OTHER PUBLICATIONS

Epimitheas Georgitzikis et al., "Integration of PbS Quantum Dot Photodiodes on Silicon for NIR Imaging", IEEE Sensors Journal, vol. 20, No. 13, Jul. 1, 2020.

(Continued)

*Primary Examiner* — Gregory D Clark
(74) *Attorney, Agent, or Firm* — LEX IP MEISTER, PLLC

(57) ABSTRACT

Disclosed are a diode element, a sensor including the same, and an electronic device. The diode element includes a first electrode, a second electrode facing the first electrode, and an active layer between the first electrode and the second electrode, wherein the active layer includes a quantum dot having an energy bandgap of about 0.1 eV to about 1.5 eV and an organic semiconductor having a wider energy bandgap than the quantum dot, and a difference between a HOMO energy level of the quantum dot and a HOMO energy level of the organic semiconductor is less than 1.0 eV.

19 Claims, 7 Drawing Sheets

(56) References Cited

U.S. PATENT DOCUMENTS

| | | | |
|---|---|---|---|
| 2015/0076469 A1* | 3/2015 | Ikemizu | H10K 50/11 257/40 |
| 2020/0403174 A1 | 12/2020 | Kim et al. | |
| 2022/0376200 A1 | 11/2022 | Kim et al. | |

FOREIGN PATENT DOCUMENTS

| | | |
|---|---|---|
| KR | 10-1328476 | 11/2013 |
| KR | 10-2014-0027215 | 3/2014 |
| KR | 10-2021-0000074 | 1/2021 |
| KR | 10-2021-0067771 | 6/2021 |
| KR | 10-2293405 | 8/2021 |

OTHER PUBLICATIONS

Yang Liu et al., "Enhanced luminescence/photodetecting bifunctional devices based on ZnO:Ga microwire/ p-Si heterojunction by incorporating Ag nanowires", Nanoscale Advances, 2021, 3, 5605-5617, DOI: 10.1039/d1na00428j.

Ning Li et al., "Electroluminescence and photo-response of inorganic halide perovskite bi-functional diodes", Nanophotonics 2018, 7(12), 1981-1988, https://doi.org/10.1515/nanoph-2018-0149.

Tae Yeon Kim et al., "Dual-functional quantum-dots light emitting diodes based on solution processable vanadium oxide hole injection layer", Scientific Repores, 2021, 11,1700.

Satoru Ohisa et al., "A Solution-Processed Heteropoly Acid Containing $MoO_3$ Units as a Hole-Injection Material for Highly Stable Organic Light-Emitting Devices", ACS Applied Materials Interfaces 2016, vol. 8, 20946-20954, Jul. 26, 2016.

Taehyun Park et al., "Self-Powered Low-Cost UVC Sensor Based on Organic-Inorganic Heterojunction for Partial Discharge Detection", Advanced Science News, Small 2021, 17, 2100695, DOI: 10.1002/smll.202100695.

Seung Ji Cha et al., "Thermally Cross-Linkable Hole Transport Polymers for Solution-Based Organic Light-Emitting Diodes", Macromol. Rapid Commun. 2014, 35, 807-812, DOI: 10.1002/marc. 201400002.

Md Arafat Mahmud et al., "Solution-Processed Lithium-Doped ZnO Electron Transport Layer(Rb, MA, FA) Perovskite Solar Cells", ACS Appl. Mater. Interfaces 2017, 9, 33841-33854, Sep. 14, 2017.

* cited by examiner

DIODE ELEMENT AND SENSOR AND ELECTRONIC DEVICE

CROSS-REFERENCE TO RELATED APPLICATION

This application claims priority to and the benefit of Korean Patent Application No. 10-2021-0167503 filed in the Korean Intellectual Property Office on Nov. 29, 2021, the entire contents of which are incorporated herein by reference.

BACKGROUND OF THE INVENTION

(a) Field of the Invention

A diode element, a sensor, and an electronic device are disclosed.

(b) Description of the Related Art

A photodiode is a device that converts light energy into electrical energy and may be effectively applied to a sensor configured to detect light. A light emitting diode is a device that converts electrical energy into light energy and may be effectively applied to various devices requiring light emission.

SUMMARY OF THE INVENTION

An embodiment provides a diode element including the functions of a photodiode and a light emitting diode.

Another embodiment provides a sensor including the diode element.

Another embodiment provides an electronic device including the diode element or the sensor.

According to an embodiment, a diode element includes a first electrode, a second electrode facing the first electrode, and an active layer between the first electrode and the second electrode, wherein the active layer includes a quantum dot having an energy bandgap of about 0.1 eV to about 1.5 eV and an organic semiconductor having a wider energy bandgap than the quantum dot, and a difference between a HOMO energy level of the quantum dot and a HOMO energy level of the organic semiconductor is less than about 1.0 eV.

The diode element may exhibit an emission state under a first bias that is one of a forward bias and a reverse bias, and a photoelectric conversion state under a second bias that is the other one of the forward bias and the reverse bias.

An absorption wavelength of the light absorbed in the photoelectric conversion state may include a longer wavelength region than an emission wavelength of the light emitted in the emission state.

The absorption wavelength may belong to an infrared light spectrum, and the emission wavelength may belong to a visible light spectrum.

A difference between the HOMO energy level of the quantum dot and the HOMO energy level of the organic semiconductor may be 0 to about 0.5 eV.

The quantum dot may include PbS, PbSe, CdZnSeS/ZnS, or a combination thereof.

The organic semiconductor may include a fluorescent polymer, a fluorescent compound, a phosphorescent polymer, a phosphorescent compound, or a combination thereof.

The organic semiconductor may include a (co)polymer including a substituted or unsubstituted phenylene structural unit, a substituted or unsubstituted vinylene structural unit, a substituted or unsubstituted thiophene structural unit, a substituted or unsubstituted fluorene structural unit, a substituted or unsubstituted spiro structural unit, or a combination thereof.

The organic semiconductor may include a copolymer represented by Chemical Formula 1.

[Chemical Formula 1]

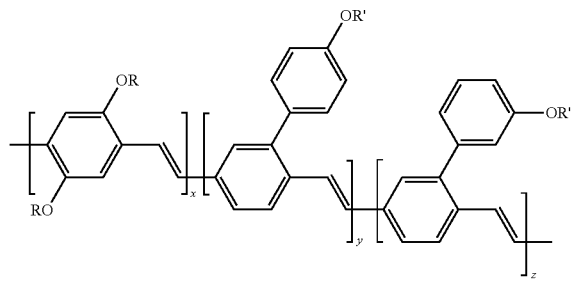

In Chemical Formula 1,

R and R' are each independently a substituted or unsubstituted C1 to C30 alkyl group, x, y, and z are each mole ratio, and $x+y+z=1$.

The organic semiconductor may include a spiro copolymer.

The active layer may include a mixture of the quantum dot and the organic semiconductor.

The quantum dot and the organic semiconductor may be included in a volume ratio of about 1:4 to about 1:8 based on the active layer.

The diode element may further include a first auxiliary layer disposed between the first electrode and the active layer and including a p-type oxide semiconductor, and a second auxiliary layer disposed between the second electrode and the active layer and including an n-type oxide semiconductor.

The p-type oxide semiconductor may include $Cu_2SnS_3$—$Ga_2O_3$, molybdenum oxide, molybdenum oxide doped with zinc oxide, or a combination thereof.

The n-type oxide semiconductor may include lithium-doped zinc oxide, zinc oxide nanoparticles, or a combination thereof.

The diode element may further include a buffer layer between the first auxiliary layer and the active layer.

The buffer layer may include poly-TPD, PEDOT:PSS, TFB, PVK, NiO, CuO, doped NiO, doped CuO, CuSnS—GaO, or a combination thereof.

According to another embodiment, a sensor including the diode element is provided.

According to another embodiment, an electronic device including the diode element or the sensor is provided.

The characteristics of the photodiode and the light emitting diode may effectively be exhibited according to an applied bias, so functions of the light source and the sensor may be provided together.

DETAILED DESCRIPTION OF THE EMBODIMENTS

Figure 1:
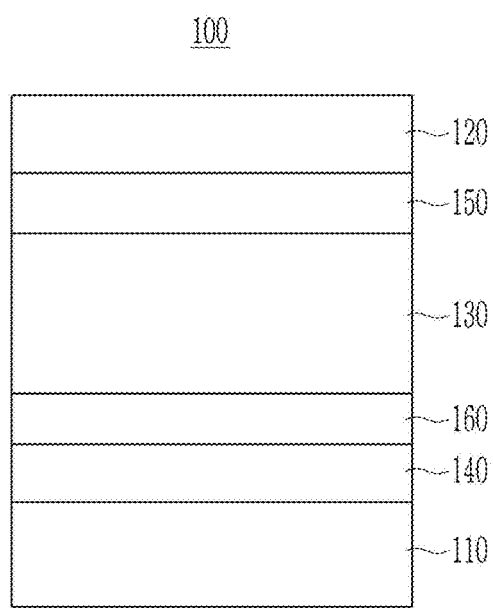
FIG. 1 is a schematic cross-sectional view showing an example of a diode element according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

Hereinafter, "combination" includes a mixture or a stacked structure of two or more.

Hereinafter, a work function, a HOMO energy level, or a LUMO energy level is expressed as an absolute value from a vacuum level. In addition, when the work function, HOMO energy level, or LUMO energy level is said to be "deep," "high," or "large," absolute values are large based on "0 eV" of the vacuum level, while when the work function, HOMO energy level, or LUMO energy level is said to be "shallow," "low," or "small," absolute values are small based on "0 eV" of the vacuum level.

Hereinafter, an energy bandgap refers to an absolute value of a difference between the HOMO energy level and LUMO energy level, and the wide energy bandgap means that an absolute value of the difference between the HOMO energy level and LUMO energy level is large.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a carbonyl group, a thiol group, an ester group, a carboxyl group, a sulfonic acid group, phosphoric acid, a C1 to C30 alkyl group, a C2 to C30 alkenyl group, a C2 to C30 alkynyl group, a C6 to C30 aryl group, a C1 to C30 alkoxy group, a C1 to C20 heteroalkyl group, a C3 to C20 heterocyclic group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, a diode element according to an embodiment will be described with reference to the drawings.

FIG. 1 is a schematic cross-sectional view showing an example of a diode element according to an embodiment.

Referring to FIG. 1, a diode element 100 according to an embodiment includes a first electrode 110, a second electrode 120, an active layer 130, a first auxiliary layer 140, a second auxiliary layer 150, and a buffer layer 160.

The first electrode 110 and the second electrode 120 face each other, and one of the first electrode 110 and the second electrode 120 is an anode and the other is a cathode. For example, the first electrode 110 may be an anode and the second electrode 120 may be a cathode. For example, the first electrode 110 may be a cathode and the second electrode 120 may be an anode.

At least one of the first electrode 110 and the second electrode 120 may be a transparent electrode. The transparent electrode may have a high transmittance of greater than or equal to about 80%, greater than or equal to about 85%, greater than or equal to about 88%, or greater than or equal to about 90%, and may include, for example, at least one of an oxide conductor, a carbon conductor, and/or a thin metal film. The oxide conductor may be for example one or more selected from indium tin oxide (ITO), indium zinc oxide (IZO), zinc tin oxide (ZTO), aluminum tin oxide (ATO), and aluminum zinc oxide (AZO). The carbon conductor may be one or more selected from graphene and a carbon nanostructure. The metal thin film may be, for example, formed with a thin thickness of several nanometers to several tens of nanometers or may be a single layer or multiple layers of a metal thin film formed with a thin thickness of several nanometers to tens of nanometers and doped with a metal oxide.

Any one of the first electrode 110 and the second electrode 120 may be a reflective electrode. The reflective electrode may have a low transmittance of, for example, less than about 10% or less than or equal to about 5%, and may include, for example, a reflective conductor, for example, a metal such as aluminum (Al), silver (Ag), gold (Au), or an alloy thereof.

The active layer 130 is between the first electrode 110 and the second electrode 120, and may be a layer in which excitons are generated by a combination of electrons and holes injected from the first electrode 110 and the second electrode 120 according to the applied bias or excitons generated by light absorption are separated into electrons and holes.

For example, the active layer 130 may be an emission layer that generates excitons by combining electrons and holes injected from the first electrode 110 and the second electrode 120 under a first bias that is one of a forward bias and a reverse bias, and may be a photoelectric layer that separates excitons generated by absorption of light into electrons and holes under a second bias that is the other one of the forward bias and the reverse bias.

As the active layer 130 functions as an emission layer or a photoelectric conversion layer according to a bias applied thereto, the diode element 100 may exhibit hybrid characteristics that show an emission state under a first bias that is either one of a forward bias and a reverse bias and a photoelectric conversion state under a second bias that is the other one of the forward bias and the reverse bias.

For example, the first bias may be the forward bias, under which the active layer 130 may be an emission layer generating excitons by combination of electrons and holes injected from the first electrode 110 and the second electrode 120, and the diode element 100 may exhibit the emission state.

For example, the second bias may be the reverse bias, under which the active layer 130 may be the photoelectric conversion layer separating the excitons produced by absorption into the electrons and the holes, and the diode element 100 may exhibit the photoelectric conversion state.

Herein, a light emitting spectrum of light emitted from the emission state of the diode element 100 may be different from an absorption spectrum of light absorbed in the photoelectric conversion state of the diode element 100, for example, an absorption wavelength of the light absorbed in the photoelectric conversion state may include a longer wavelength region than an emission wavelength of the light emitted in the emission state. For example, the peak absorption wavelength a ($\lambda_{peak,A}$) in the photoelectric conversion state may belong to a longer wavelength region than the peak emission wavelength ($\lambda_{peak,E}$) in the emission state. For example, in the photoelectric conversion state, the peak absorption wavelength a ($\lambda_{peak,A}$) may belong to a visible light to infrared light spectrum, and in the emission state, the peak emission wavelength ($\lambda_{peak,E}$) may belong to the visible light spectrum. For example, the peak absorption wavelength ($\lambda_{peak,A}$) of the diode element 100 in the photoelectric conversion state may belong to a range of about 400 nm to about 3000 nm, and within the above range, about 450 nm to about 3000 nm, about 500 nm to about 3000 nm, about 600 nm to about 3000 nm, about 700 nm to about 3000 nm, about 750 nm to about 3000 nm, about 750 nm to about 2500 nm, about 750 nm to about 2000 nm, or about 750 nm to about 1500 nm. For example, the peak emission wavelength ($\lambda_{peak,E}$) of the diode element 100 in the emission state may belong to a range of about 380 nm to about 700 nm, and within the above range, greater than or equal to about 380 nm and less than about 500 nm, about 500 nm to about 600 nm, and greater than about 600 nm and less than or equal to about 700 nm. For example, the peak absorption wavelength ($\lambda_{peak,A}$) may belong to the infrared light spectrum, and a difference between the peak absorption wavelength ($\lambda_{peak,A}$) and the peak emission wavelength ($\lambda_{peak,E}$) may be greater than or equal to about 100 nm, and within the above range, greater than or equal to about 200 nm, greater than or equal to about 300 nm, greater than or equal to about 400 nm, or greater than or equal to about 500 nm, and within the above range, about 100 nm to about 1000 nm, about 200 nm to about 1000 nm, about 300 nm to about 1000 nm, about 400 nm to about 1000 nm, or about 500 nm to about 1000 nm.

The active layer 130 may include a plurality of materials capable of exhibiting such hybrid characteristics, and may include quantum dots and organic semiconductors having different electrical characteristics. Herein, the quantum dots may be light absorbing materials configured to absorb light of a predetermined wavelength spectrum, and the organic semiconductors may be light emitting materials configured to emit light of a predetermined wavelength spectrum.

For example, the HOMO energy levels of the quantum dots and the organic semiconductors may be the same or a difference therebetween may be relatively small. For example, the difference between the HOMO energy level of the quantum dots and the organic semiconductors may be less than about 1.0 eV, and within the above range, 0 to about 0.8 eV, 0 to about 0.5 eV, 0 to about 0.3 eV, 0 to about 0.2 eV, 0 to about 0.1 eV, or 0. Accordingly, hybrid characteristics according to the aforementioned applied bias may be effectively implemented.

For example, the HOMO energy levels of the quantum dots and the organic semiconductors may each independently belong to a range of about 4.0 eV to about 6.0 eV, and within the above range, about 4.2 eV to about 5.8 eV, about 4.5 eV to about 5.5 eV, and about 4.7 eV to about 5.4 eV, or about 4.9 eV to about 5.4 eV.

For example, the quantum dots may have an energy bandgap of about 0.5 eV to about 1.5 eV, and within the above range, an energy bandgap of about 0.7 eV to about 1.3 eV or about 0.8 eV to about 1.2 eV. Since the quantum dots have an energy bandgap within the above range, the quantum dots may be configured to effectively absorb light in an infrared wavelength spectrum to photoelectrically convert the absorbed light. The quantum dots may include, for example, PbS, PbSe, CdZnSeS/ZnS, or a combination thereof.

As an example, the organic semiconductor may have a wider energy bandgap than quantum dots, and within the above range, an energy bandgap of greater than or equal to about 1.6 eV, greater than or equal to about 1.8 eV, or greater than or equal to about 1.9 eV, and within the above range, an energy bandgap of about 1.6 eV to about 3.0 eV, about 1.8 eV to about 3.0 eV, about 1.9 eV to about 3.0 eV, about 1.6 eV to about 2.8 eV, about 1.8 eV to about 2.8 eV, about 1.9 eV to about 2.8 eV, about 1.6 eV to about 2.5 eV, about 1.8 eV to about 2.5 eV, or about 1.9 eV to about 2.5 eV. The organic semiconductors may be configured to effectively emit light of a visible light wavelength spectrum by having an energy bandgap within the above range. The organic semiconductors may include, for example, a fluorescent polymer, a fluorescent compound, a phosphorescent polymer, a phosphorescent compound, or a combination thereof which satisfies the aforementioned energy levels.

For example, the organic semiconductors may be polymer semiconductors and may include (co)polymers including a substituted or unsubstituted phenylene structural unit, a substituted or unsubstituted vinylene structural unit, a substituted or unsubstituted thiophene structural unit, a substituted or unsubstituted fluorene structural unit, a substituted or unsubstituted spiro structural unit, or a combination thereof.

For example, the organic semiconductors may include polyphenylene, polyphenylenevinylene, polythiophene, polyfluorene, a spiro copolymer, a derivative thereof, a copolymer thereof, or a combination thereof.

For example, the organic semiconductors may be polyphenylenevinylene copolymers or derivatives thereof, and may be, for example, represented by Chemical Formula 1, but are not limited thereto.

[Chemical Formula 1]

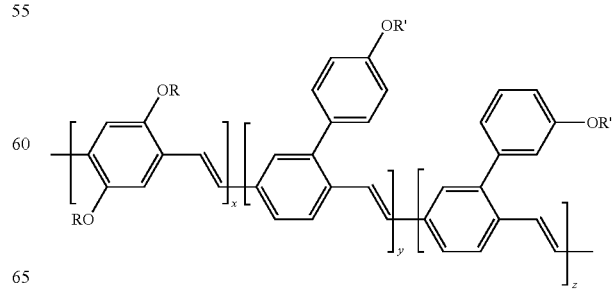

In Chemical Formula 1,

R and R' may each independently be a substituted or unsubstituted C1 to C30 alkyl group, x, y, and z may each be a mole ratio, and x+y+z=1.

For example, the organic semiconductor may be a spiro copolymer.

The active layer 130 may include a mixture of quantum dots and an organic semiconductor, and for example, an amount of an organic semiconductor may be larger than that of the quantum dots in the active layer 130. For example, the quantum dot and the organic semiconductor may be included in a volume ratio of about 1:2 to about 1:10, and within the above range, about 1:3 to about 1:10, about 1:4 to about 1:10, about 1:4 to about 1:8, or about 1:4 to about 1:6 based on the active layer 130, but is not limited thereto.

The first auxiliary layer 140 may be disposed between the first electrode 110 and the active layer 130, and may effectively transport charges (e.g., holes or electrons) between the first electrode 110 and the active layer 130.

The first auxiliary layer 140 may include, for example, a p-type semiconductor, and accordingly, holes may be effectively transported from the first electrode 110 to the active layer 130 under the first bias, and holes separated from the active layer 130 may be effectively transported to the first electrode 110 under the second bias.

The p-type semiconductor may be, for example, a p-type oxide semiconductor, for example $Cu_2SnS_3$—$Ga_2O_3$, molybdenum oxide ($MoO_x$, $0<x\leq3$), molybdenum oxide ($MoO_x$, $0<x\leq3$) doped with zinc oxide (ZnO), or a combination thereof. These p-type oxide semiconductors may have high light transmittance while having high hole mobility.

The second auxiliary layer 150 is disposed between the second electrode 120 and the active layer 130 and may effectively transport charges (e.g., electrons or holes) between the second electrode 120 and the active layer 130.

The second auxiliary layer 150 may include, for example, an n-type semiconductor, and accordingly, electrons may be effectively transported from the second electrode 120 to the active layer 130 under the first bias, and electrons separated from the active layer 130 may be effectively transported to the second electrode 120 under the second bias.

The n-type semiconductor may be, for example, an n-type oxide semiconductor, and may include, for example, lithium-doped zinc oxide, zinc oxide nanoparticles, or a combination thereof. These n-type oxide semiconductors may have high light transmittance while having high electron mobility.

The buffer layer 160 is disposed between the first auxiliary layer 140 and the active layer 130.

The buffer layer 160 may include, for example, an organic material, an inorganic material, an organic/inorganic material, or a combination thereof that has a HOMO energy level that is deeper or shallower than the HOMO energy level of the quantum dots and/or the organic semiconductor of the active layer 130 by less than about 1.0 eV. Within the above range, a difference between the HOMO energy level of the buffer layer 160 and the HOMO energy level of the active layer 130 may be greater than or equal to about 0.1 eV and less than about 1.0 eV, about 0.1 eV to about 0.8 eV, about 0.1 eV to about 0.6 eV, or about 0.1 eV to about 0.5 eV. The buffer layer 160 may include, for example, a hole transporting organic material, such as poly-TPD, PEDOT:PSS, TFB, PVK, NiO, CuO, doped NiO, doped CuO, CuSnS—GaO, or a combination thereof.

As described above, the aforementioned diode element 100 may exhibit the emission state or the photoelectric conversion state according to the applied bias and thus has the hybrid characteristics having both of functions of a light emitting element and a photoelectric conversion element. This diode element 100 may be effectively applied to a sensor, for example, to an infrared sensor detecting light of the infrared light spectrum.

The aforementioned diode element 100 or sensor may be applied to various electronic devices, for example, a mobile phone, a digital camera, a biometric device, a security device, and/or an automobile electronic component, but is not limited thereto.

Hereinafter, the embodiments are illustrated in more detail with reference to examples. However, these are merely examples, and the present scope is not limited thereto.

Preparation Examples: Preparation of Solution for Active Layer

Preparation Example 1

0.00880 g of a polymer semiconductor (PDY-132, Merck) was dissolved in 20 ml of toluene to prepare a polymer semiconductor solution at a concentration of 0.5 wt %. Subsequently, 20 ml of the polymer semiconductor solution and 5 ml of a PbS solution (10 mg/ml, solvent: toluene, Manufacturer: Quantum Solutions) were blended to prepare a solution for an active layer.

Preparation Example 2

0.00670 g of a polymer semiconductor (SPR-001, Merck) was dissolved in 20 ml of toluene to prepare a polymer semiconductor solution at a concentration of 0.5 wt %. Subsequently, 18 ml of the polymer semiconductor solution was blended with 3 ml of a PbS solution (10 mg/ml, Solvent: toluene, manufacturer: Quantum Solutions) to prepare a solution for an active layer.

Reference Preparation Example 1

0.00880 g of a polymer semiconductor (PDY-132) was dissolved in 20 ml of toluene to prepare a solution for an active layer at a concentration of 0.5 wt %.

Reference Preparation Example 2

0.00670 g of a polymer semiconductor (SPR-001) was dissolved in 20 ml of toluene to prepare a solution for an active layer at a concentration of 0.5 wt %.

Reference Preparation Example 3

A solution for an active layer including a PbS solution (10 mg/ml, Solvent: toluene, Manufacturer: Quantum Solutions) was prepared.

Example: Manufacture of Diode Element

Example 1

ITO (work function: 4.8 eV) was sputtered on a glass substrate to form a 200 nm-thick lower electrode (anode). Subsequently, on the lower electrode, 10 mg/ml of $MoO_3$ dispersion prepared by dispersing 200 mg of $MoO_3$ in 200 ml of isopropyl alcohol (IPA) was spin-coated at 3000 rpm for 35 seconds and annealed under a nitrogen atmosphere at 200° C. for 10 minutes to form a 15 nm-thick lower auxiliary layer (HOMO: 8.8 eV, LUMO: 5.4 eV). On the lower auxiliary layer, 0.5 wt % of a solution for a buffer layer prepared by dissolving 0.0166 g of poly-TPD in 3 ml of chlorobenzene was spin-coated at 2000 rpm for 35 seconds and annealed at 150° C. for 10 minutes to form a 30 nm-thick buffer layer (HOMO: 5.4 eV, LUMO: 2.3 eV). On the buffer layer, the solution for an active layer according to Preparation Example 1 was spin-coated at 3000 rpm for 35 seconds and annealed under a nitrogen atmosphere at 150° C. for 10 minutes to form a 60 nm-thick active layer including a mixture of PDY-132 (HOMO: 5.0 eV, LUMO: 2.8 eV) and PbS (HOMO: 5.0 eV, LUMO: 4.0 eV). On the active layer, a solution for an upper auxiliary layer prepared by dissolving 0.2195 g of Zn and 0.00940 g of Li acetate hydrate in 10 ml of isopropyl alcohol (IPA) in a water bath (40° C.) for 6 hours was spin-coated at 1000 rpm for 35 seconds and annealed at 150° C. for 10 minutes to form a 30 nm-thick upper auxiliary layer (HOMO: 6.8 eV, LUMO: 3.6 eV), and aluminum (work function: 4.3 eV) was deposited to form a 100 nm-thick upper electrode (cathode), manufacturing a diode element.

Example 2

A diode element was manufactured in the same manner as in Example 1, except that the solution for an active layer according to Preparation Example 2 instead of the solution for an active layer according to Preparation Example 1 was used to form a 60 nm-thick active layer including a mixture of SPR-001 (HOMO: 5.38 eV, LUMO: 3.39 eV) and PbS (HOMO: 5.00 eV, LUMO: 4.00 eV).

Reference Example 1

A diode element was manufactured in the same manner as in Example 1, except that the solution for an active layer according to Reference Preparation Example 1 instead of the solution for an active layer according to Preparation Example 1 was used to form a 60 nm-thick active layer including PDY-132 (HOMO: 5.0 eV, LUMO: 2.8 eV).

Reference Example 2

A diode element was manufactured in the same manner as in Example 2, except that the solution for an active layer according to Reference Preparation Example 2 instead of the solution for an active layer according to Preparation Example 2 was used to form a 60 nm-thick active layer including SPR-001 (HOMO: 5.38 eV, LUMO: 3.39 eV).

Reference Example 3

A diode element was manufactured in the same manner as in Example 1, except that the solution for an active layer according to Reference Preparation Example 3 instead of the solution for an active layer according to Preparation Example 1 was used to form a 60 nm-thick active layer including PbS (HOMO: 5.00 eV, LUMO: 4.00 eV).

Evaluation I

Current characteristics of the diode elements according to Examples were evaluated.

Figure 2:
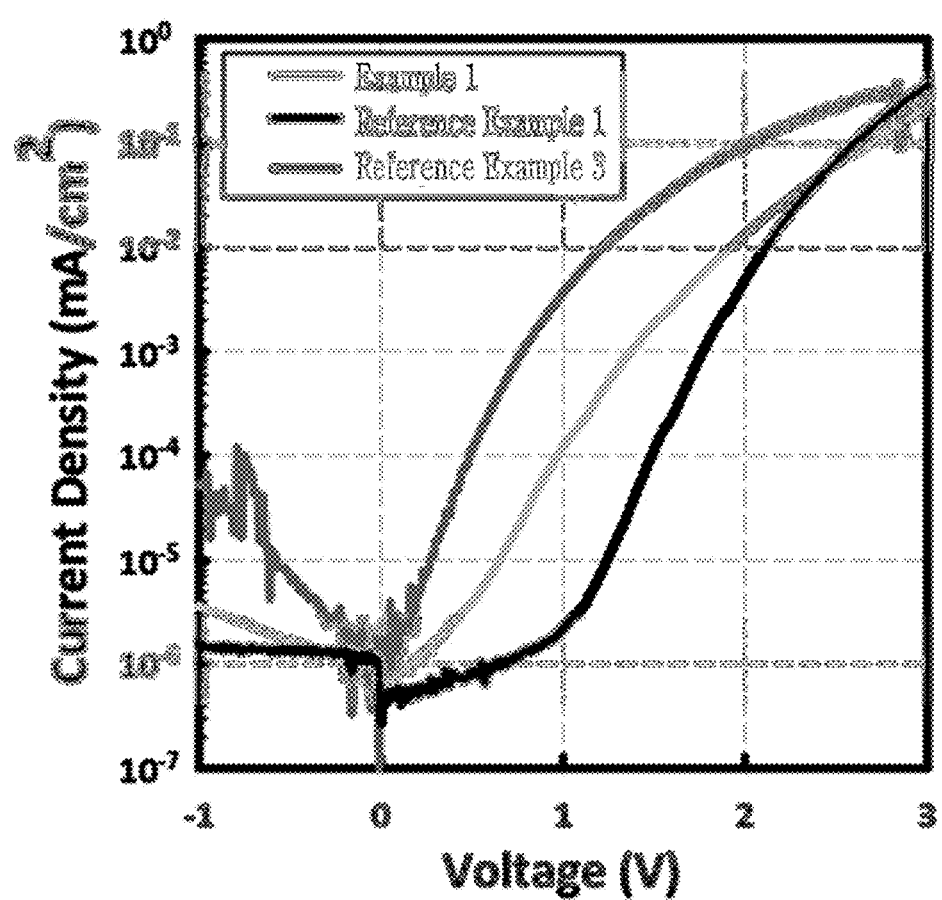
FIG. 2 is a graph showing current characteristics according to voltage of diode elements according to Examples and Reference Examples.

The results are shown in Table 1 and FIG. 2.

FIG. 2 is a graph showing current characteristics according to a voltage of diode elements according to Example 1 and Reference Examples 1 and 3.

TABLE 1

| | $I_{on}/I_{off}$ |
|---|---|
| Example 1 | $6.16 \times 10^4$ |
| Reference Example 1 | $2.31 \times 10^5$ |
| Reference Example 3 | $5.81 \times 10^3$ |
| Example 2 | $3.96 \times 10^2$ |

Referring to Table 1 and FIG. 2, the diode elements according to Examples and Reference Examples exhibited diode characteristics within a voltage range of −1 V to 3 V.

Evaluation II

Luminescence properties under a forward bias of the diode elements according to Examples were evaluated.

The luminescence properties were evaluated by measuring color coordinates and luminance, while applying a voltage of 0 to 10 V to the diode elements according to Examples and Reference Examples.

Figure 3:
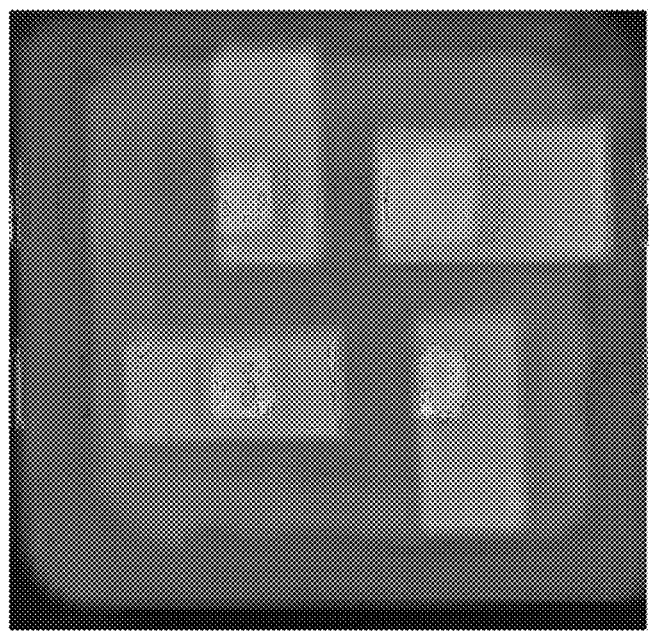
FIG. 3 is a photograph showing yellow light emission under a forward bias of the diode element according to Example 1.
Figure 4:
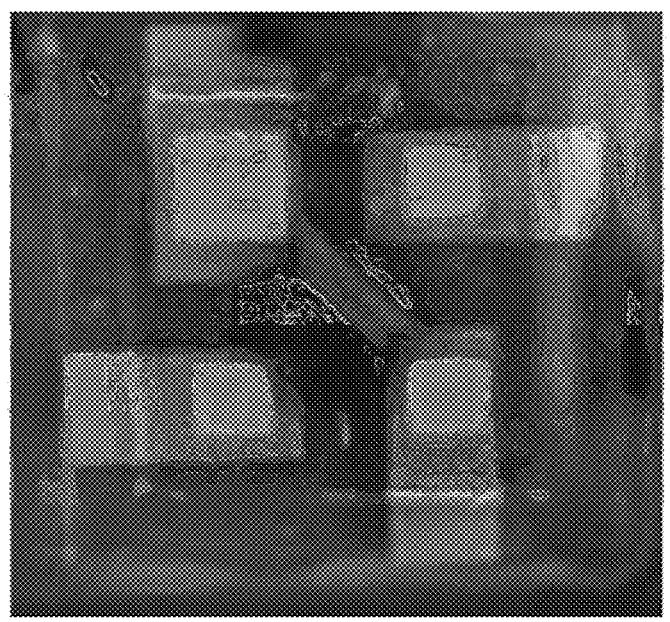
FIG. 4 is a photograph showing red light emission under a forward bias of the diode element according to Example 2.
Figure 5:
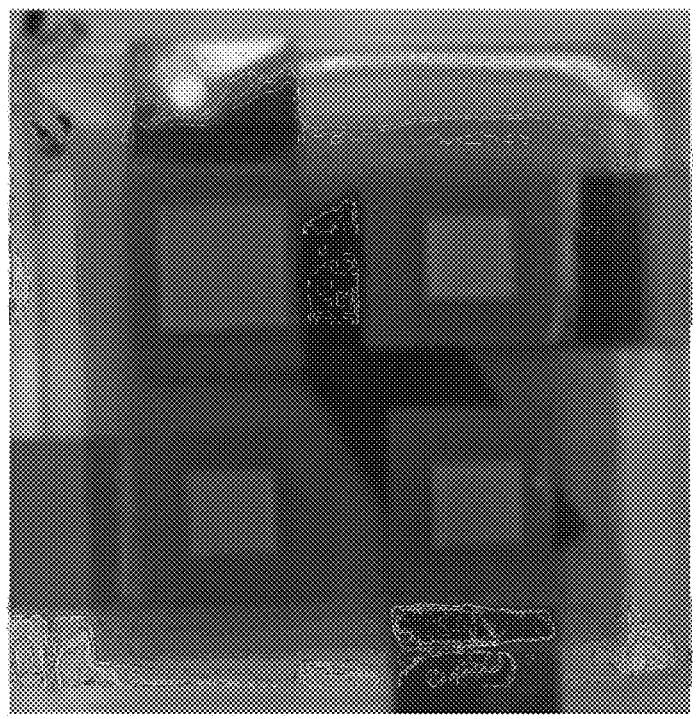
FIG. 5 is a photograph showing no light emission under a forward bias according to Reference Example 3.

The results are shown in Table 2 and FIGS. 3 to 5.

FIG. 3 is a photograph showing yellow light emission under a forward bias of the diode element according to Example 1, FIG. 4 is a photograph showing red light emission under a forward bias of the diode element according to Example 2, and FIG. 5 is a photograph showing no light emission under a forward bias according to Reference Example 3.

TABLE 2

| | Color coordinates (x, y) |
|---|---|
| Example 1 | 0.44, 0.55 |
| Reference Example 1 | 0.45, 0.53 |
| Example 2 | 0.66, 0.34 |
| Reference Example 2 | 0.67, 0.33 |

Referring to Table 2 and FIGS. 3 and 4, the diode elements according to Examples 1 and 2 respectively exhibited luminescence properties under a forward bias and emitted light with color coordinates within a substantially similar range to that of the diode elements according to Reference Examples 1 and 2. On the contrary, referring to FIG. 5, the diode element according to Reference Example 3 emitted no light under a forward bias. Accordingly, the diode elements according to Examples 1 and 2 exhibited satisfactory luminescence properties under a forward bias.

Evaluation III

Light absorption characteristics under a reverse bias of the diode elements according to Examples were evaluated.

The light absorption characteristics were confirmed while irradiating light of a visible light wavelength region and a wavelength of 1070 nm (infrared light) respectively to the diode elements according to Examples. Herein, the characteristics were confirmed while a voltage of −1 V to 3 V was applied to the diode elements.

Figure 6:
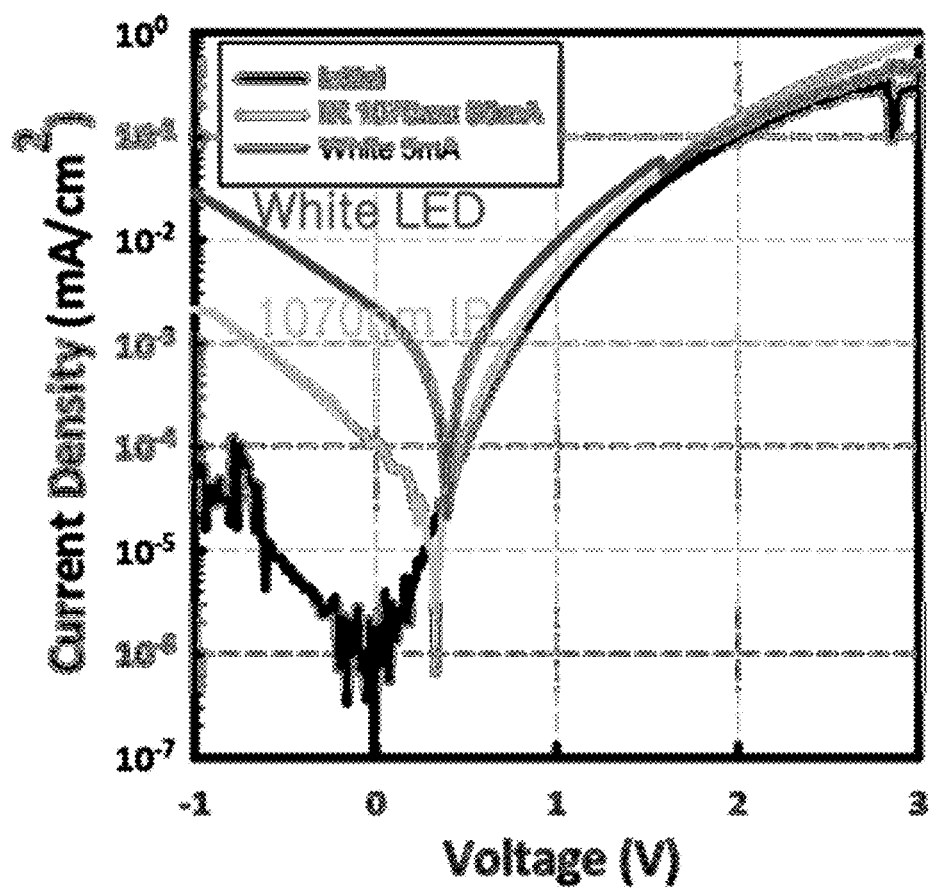
FIG. 6 is a graph showing the relationship between voltage and current density when light is not incident and when light is incident on the diode element according to Example 1.
Figure 7:
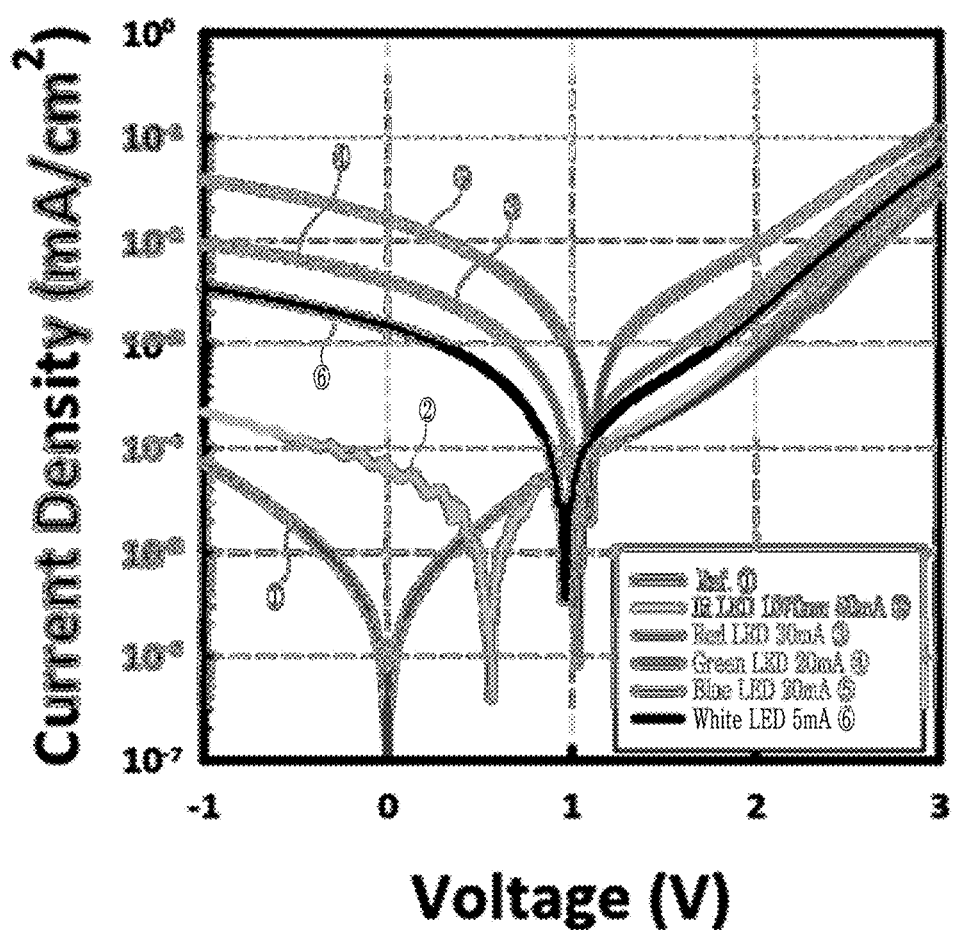
FIG. 7 is a graph showing the relationship between voltage and current density when light is not incident and when light is incident on the diode element according to Example 2.

FIG. 6 is a graph showing the relationship between voltage and current density when light is not incident (initial state) and when light is incident on the diode element according to Example 1, and FIG. 7 is a graph showing the relationship between voltage and current density when light is not incident and when light is incident on the diode element according to Example 2.

Referring to FIGS. 6 and 7, the diode elements according to Examples exhibited an off-current when light was irradiated, which was different from an off current in a state (initial or Ref.) that the light was not irradiated. Accordingly, the diode elements according to Examples 1 and 2 exhibited satisfactory light absorption characteristics (photoelectric conversion characteristics) under a reverse bias.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A diode element, comprising:
a first electrode,
a second electrode facing the first electrode, and
an active layer between the first electrode and the second electrode,
wherein the active layer includes
a quantum dot having an energy bandgap of about 0.1 eV to about 1.5 eV, and
an organic semiconductor having a wider energy bandgap than the quantum dot, and
a difference between a HOMO energy level of the quantum dot and a HOMO energy level of the organic semiconductor is less than 1.0 eV.

2. The diode element of claim 1, wherein
the diode element exhibits an emission state under a first bias that is one of a forward bias and a reverse bias, and
a photoelectric conversion state under a second bias that is the other one of the forward bias and the reverse bias.

3. The diode element of claim 2, wherein an absorption wavelength of the light absorbed in the photoelectric conversion state includes a longer wavelength region than an emission wavelength of the light emitted in the emission state.

4. The diode element of claim 3, wherein
the absorption wavelength belongs to an infrared light spectrum, and
the emission wavelength belongs to a visible light spectrum.

5. The diode element of claim 1, wherein a difference between the HOMO energy level of the quantum dot and the HOMO energy level of the organic semiconductor is 0 to about 0.5 eV.

6. The diode element of claim 1, wherein the quantum dot includes PbS, PbSe CdZnSeS/ZnS, or a combination thereof.

7. The diode element of claim 1, wherein the organic semiconductor includes a fluorescent polymer, a fluorescent compound, a phosphorescent polymer, a phosphorescent compound, or a combination thereof.

8. The diode element of claim 7, wherein the organic semiconductor includes a (co)polymer including a substituted or unsubstituted phenylene structural unit, a substituted or unsubstituted vinylene structural unit, a substituted or unsubstituted thiophene structural unit, a substituted or unsubstituted fluorene structural unit, a substituted or unsubstituted spiro structural unit, or a combination thereof.

9. The diode element of claim 7, wherein the organic semiconductor is a copolymer represented by Chemical Formula 1:

[Chemical Formula 1]

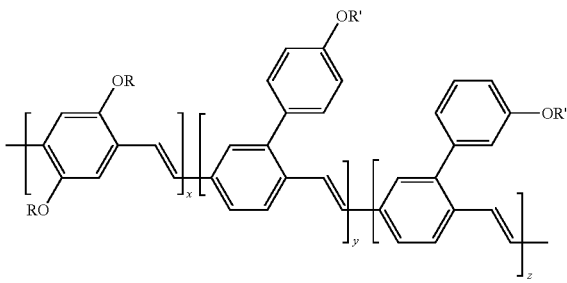

wherein, in Chemical Formula 1,
R and R' are each independently a substituted or unsubstituted C1 to C30 alkyl group,
x, y, and z are each a mole ratio, and x+y+z=1.

10. The diode element of claim 7, wherein the organic semiconductor includes a spiro copolymer.

11. The diode element of claim 1, wherein the active layer includes a mixture of the quantum dot and the organic semiconductor.

12. The diode element of claim 11, wherein the quantum dot and the organic semiconductor are included in a volume ratio of about 1:4 to about 1:8 based on the active layer.

13. The diode element of claim 1, further comprising:
a first auxiliary layer between the first electrode and the active layer and including a p-type oxide semiconductor, and
a second auxiliary layer between the second electrode and the active layer and including an n-type oxide semiconductor.

14. The diode element of claim 13, wherein the p-type oxide semiconductor includes $Cu_2SnS_3$—$Ga_2O_3$, molybdenum oxide, molybdenum oxide doped with zinc oxide, or a combination thereof.

15. The diode element of claim 13, wherein the n-type oxide semiconductor includes lithium-doped zinc oxide, zinc oxide nanoparticles, or a combination thereof.

16. The diode element of claim 13, further comprising a buffer layer between the first auxiliary layer and the active layer.

17. The diode element of claim 16, wherein the buffer layer includes include poly-TPD, PEDOT:PSS, TFB, PVK, NiO, CuO, doped NiO, doped CuO, CuSnS—GaO, or a combination thereof.

18. A sensor comprising the diode element of claim 1.

19. An electronic device comprising the sensor of claim 18.

* * * * *